United States Patent [19]

Chen et al.

[11] 4,434,479
[45] Feb. 28, 1984

[54] NONVOLATILE MEMORY SENSING SYSTEM

[75] Inventors: Yung J. Chen, Weston, Mass.; Eden Y. C. Mei, Huntington Beach, Calif.

[73] Assignee: McDonnell Douglas Corporation, Long Beach, Calif.

[21] Appl. No.: 317,007

[22] Filed: Nov. 2, 1981

[51] Int. Cl.³ ............................................ G11C 11/40
[52] U.S. Cl. .................................. 365/210; 365/203; 365/218
[58] Field of Search ............... 365/174, 202, 203, 204, 365/207, 210, 218; 357/23

[56] References Cited

U.S. PATENT DOCUMENTS 4,376,987  3/1983  Hsia ................................ 365/210

*Primary Examiner*—Terrell W. Fears
*Attorney, Agent, or Firm*—Gregory A. Cone; George W. Finch; Donald L. Royer

[57] ABSTRACT

A sensing system for a nonvolatile memory transistor array employs reference transistors which are substantially identical to the memory transistors within the array and employs means to program the threshold voltage levels of the reference transistors to a lower level than that of the memory transistors within the array such that the changes in the electrical characteristics of both the memory and the reference transistors are proportional over time, the system thereby being rendered self-tracking.

7 Claims, 4 Drawing Figures

NONVOLATILE MEMORY SENSING SYSTEM

BACKGROUND OF THE INVENTION

1. FIELD OF THE INVENTION

This invention relates to sensing systems for nonvolatile memory transistor arrays.

2. DESCRIPTION OF THE PRIOR ART

Nonvolatile memory transistor arrays have seen substantial development over the last several years. Of course, the nonvolatility of these transistor arrays is a highly desirable characteristic in that the information, the logic state written into the transistor, is not lost during a power-off state. A significant part of this continuing development has been in the specific fields of MNOS (Metal Nitride Oxide Silicon) memory transistors and floating gate memory transistors. However, for both of these specific types of memory transistors, the electrical characteristics of the transistor change over the course of time as the transistor is continually written and erased. Indeed, such degradation occurs even during static states.

In the nonvolatile MNOS memory application, the information in the form of digital "1" and "0" states is recorded within the MNOS transistor by stressing the transistor gate with high voltages of opposite polarities, usually on the order of ±20 to 25 volts. The MNOS memory transistor is specifically constructed such that the stressing of the transistor gate will cause a substantially permanent change in the threshold voltage level of the transistor. The two different threshold voltage levels correspond to the "1" and "0" digital logic states desired to be recorded. By appropriately sensing the state of an individual memory transistor within the memory transistor array, the digital logic information recorded within each transistor within the array may be accessed.

More specifically, in the case of an N-channel MNOS transistor, the application of a positive voltage on the order of 20 to 25 volts to the gate of the transistor in a write operation will cause the threshold of the device to shift in the positive direction. Conversely, a negative voltage of similar amplitude in an erase operation will cause the threshold voltage level to shift in a negative direction. Normally the more positive threshold is defined as a binary "0" and the less positive is defined as a binary "1".

The threshold shift in the MNOS transistor is due to the trapping by the silicon nitride layer of charges which tunnel through the thin gate oxide layer under the influence of the high field produced by the gate voltage stress. In some instances the charges can also be injected directly from the gate. In any case, the charges initially reside near the SiN (silicon nitride)-SiO$_2$ (silicon dioxide) interface, but, over time tend to redistribute themselves through out the SiN due to Coulombic repulsion. Additionally, some of the stored charge will leak back to the silicon substrate by tunneling through the thin silicon dioxide layer. By the action of either of these processes, the device will tend to lose the stored information over time, a property characterized as limited "retention".

Additionally, the MNOS memory transistor "degrades" with the number of times it has been programmed. Its characteristics change because of this endurance defect. In most cases, this degradation will be manifested by either a worsening in the retention properties of the device or a gradual drift in the threshold voltage level towards a more positive voltage. Also, interrogation of the device (sensing) is only partially nondestructive. This phenomenon is known as the read-disturb effect.

In order to sense the threshold voltage level of an individual transistor within the memory array, a "reference" must be provided which will distinguish between the two possible threshold voltage levels of the individual memory transistor. In the ideal case, the reference should function over a wide range of programming voltages and programming times, since both voltage and time determine the programmed threshold voltage level of the individual MNOS transistors. The reference procedure must track the individual MNOS transistor characteristics as they change over time under the influence of the retention, endurance, and redisturb effects. Prior art devices commonly use separate MOS nonmemory transistors as the reference devices. These MOS transistors are specifically constructed to produce the desired threshold voltage level for the reference device. However, these prior art MOS reference devices have threshold reference characteristics which are constant over time. Since the memory MNOS transistors have threshold voltage characteristics which change over time, the prior art MOS reference devices are not entirely suitable. In the present invention, identical MNOS transistor devices are utilized as reference transistors, thereby imparting a self-tracking ability to the sensing system.

Floating gate nonvolatile memory transistors represent another nonvolatile memory technology. As in the MNOS technology, the threshold voltage level of an individual floating gate memory transistor can be programmed to either a logic "1" or a logic "0" state. Either tunnelling or avalanche injection mechanisms can be employed to transfer the charges into the isolated polysilicon layer by the action of a large programming field across the gate dielectric. Although the readisturb and retention effects are less severe for the floating gate devices than for the MNOS devices, the floating gate devices exhibit much more severe endurance effects because of the large electric field required to program the device. Strategies for the design of the sensing system for the floating gate nonvolatile transistors are similar to the design strategies for the MNOS memory arrays.

SUMMARY OF THE INVENTION

In the system of this invention, identical MNOS (or floating gate) devices are used to provide self-tracking references to the MNOS (or floating gate) memory transistor arrays. This sensing scheme is independent of operating conditions and is usable throughout the life of the nonvolatile memory transistors. In this sensing system the reference device is programmed (either write or erase) by a lower voltage than are the memory transistors. The programmed reference device will therefore have a threshold voltage level which is between that of a "1" and that of a "0" threshold voltage level in a nonvolatile memory transistor within the memory array. Since the reference device is operated under similar conditions to those acting upon the memory transistors within the memory array, the reference device will have similar retention endurance and redisturb characteristics to the individual transistors within the memory array.

DETAILED DESCRIPTION OF THE INVENTION

The nonvolatile memory sensing system of this invention utilizes reference devices which are substantially identical to the nonvolatile memory transistors within the memory array. This sensing scheme is independent of operating conditions and is usable throughout the life of the nonvolatile memory transistor array. In this system, the reference device is normally programmed (either write or erase) with a lower voltage than are the memory transistors within the memory array. The resulting threshold voltage for the reference devices is between the threshold voltage levels of the memory transistors within the memory array which correspond to logic "1" and logic "0" levels. Since the reference device is operated under conditions which are substantially parallel to those controlling the memory transistors within the memory array, the reference device has similar retention, endurance and read disturb characteristics to those of the memory transistors within the memory array.

Figure 1:
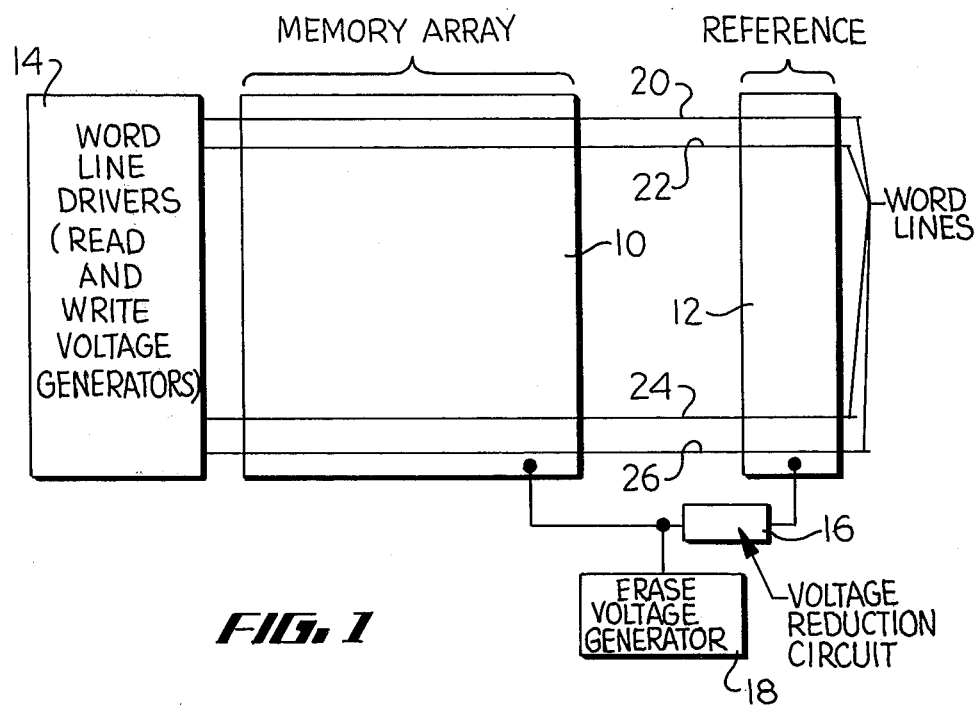
FIG. 1 is a schematic diagram of the sensing system as implemented for a weak erase.

In FIG. 1 the reference bit lines 12 share the same word line drivers for read and write functions 20, 22, 24, 26 with the memory arrays 10. The erase function can be selected as either a weak erase, useful mainly for nonvolatile RAM operation, or for bulk erase. For MNOS devices and the floating gate devices which employ the tunnelling mechanism, the erase operation is generally accomplished by powering the substrate with respect to the grounded gate. In order to ensure that the reference devices have the same endurance characteristics as do the memory devices, an initialization bulk write operation is recommended. By reducing the erase voltage which operates upon the reference device, the threshold voltage of the reference device is caused to be somewhat higher than that of the memory devices. The threshold voltage shift depends on the amount of voltage reduction by the reference reduction circuit 16, which in turn can be individually tailored to specific processing conditions and design margin requirements.

Figure 2:
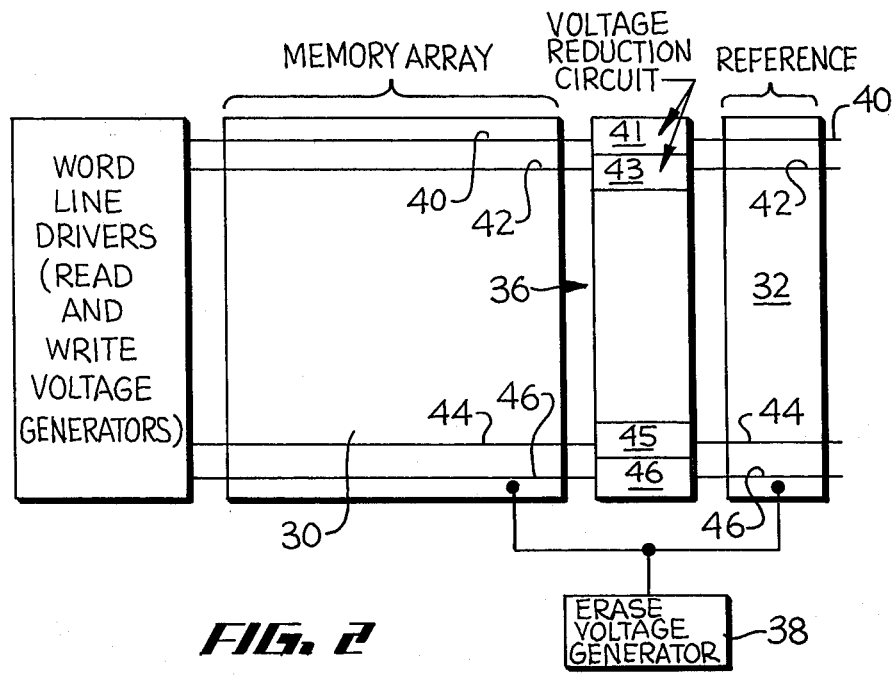
FIG. 2 is a schematic diagram of the sensing system as implemented for a weak write.

FIG. 2 is a schematic diagram of another embodiment of the invention in which a weak write operation is implemented. This configuration is useful in avalanche injection floating gate devices. In such device, the erase generation operation is accomplished by a bulk erase step utilizing ultraviolet light. For such devices, the programming of the reference device can only be accomplished by a weak write operation. In FIG. 2 the weak write operation for the reference devices is accomplished by modifying the word line driver of the reference devices 41, 43, 45, 46, by means of a voltage reduction circuit 36. Alternatively, a weak inhibit-write circuit could be added to the reference bit lines 32. This weak write operation can also be applied to MNOS nonvolatile memory systems. The choice of using either a weak erase or a weak write scheme depends on the device characteristics and the circuit/system requirements.

Figure 3:
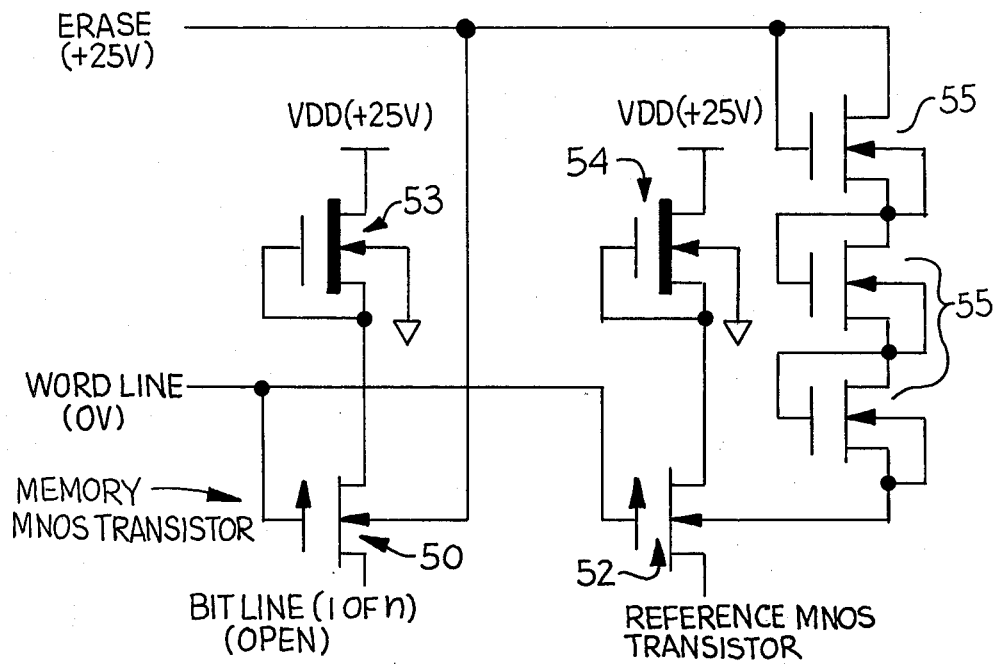
FIG. 3 is a circuit design for the weak erase voltage reduction circuit.

FIG. 3 illustrates one particular weak erase implementation. This circuit as illustrated is operated in the erase mode. The gates of the memory MNOS transistor 50 and the reference MNOS transistor 52 are connected to the word line which is held at zero volts dc. The drain of the memory MNOS transistor is connected to $V_{DD}$ (here +25 volts dc) through a gate follower depletion mode transistor 53. The drain electrode of the reference MNOS transistor 52 is similarly connected to $V_{DD}$ through another gate follower depletion mode transistor 54. The source of the memory MNOS transistor is connected to its respective bit line within the memory array and the source of the reference MNOS transistor is similarly connected to its respective reference line. The erase voltage operating upon the memory MNOS transistor here is the full indicated +25 volts. The erase voltage operating upon the reference MNOS transistor is reduced here in the amount of 2.4 volts by the use of the three transistor load elements 55 employed. In this manner, the erase voltage which operates upon the reference MNOS transistor is reduced to the level of approximately 22.6 volts in this example as opposed to the 25 volts erase voltage which operates upon the MNOS transistors within the memory array.

Figure 4:
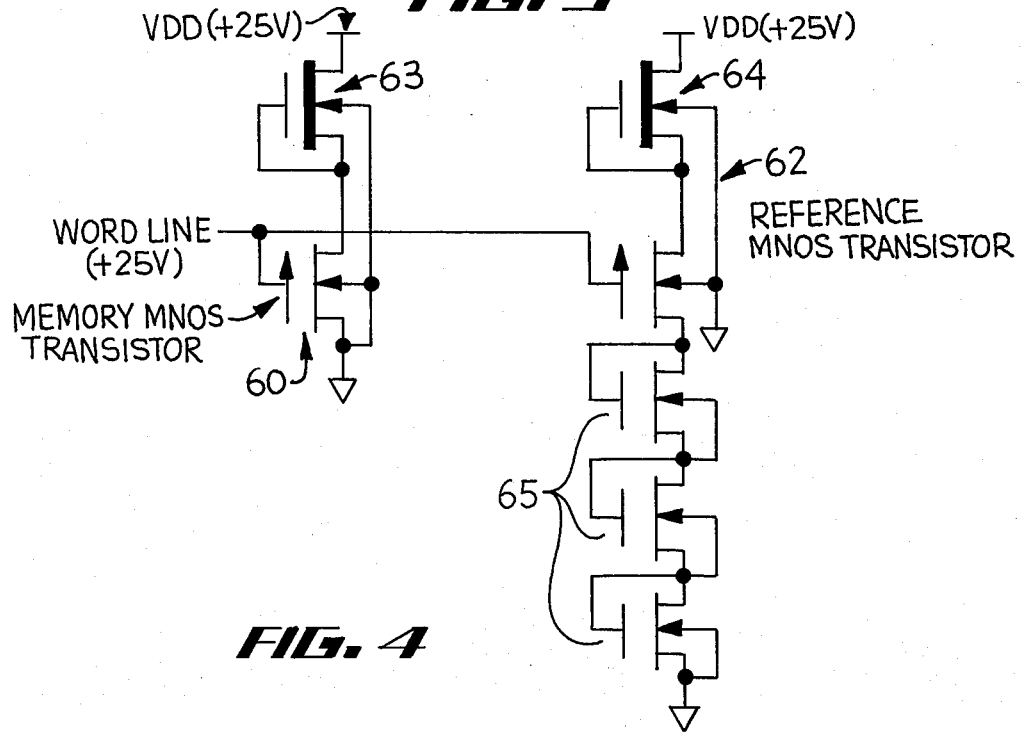
FIG. 4 is a circuit design for the weak write voltage reduction circuit.

FIG. 4 illustrates a weak write implementation corresponding to FIG. 2. This configuration is similar to that found in FIG. 3 above. The gates of both the memory MNOS transistor 60 and the reference MNOS transistor 62 are connected to the word line driver, here operated at +25 volts. The drains of both the memory MNOS transistor 60 and the reference MNOS transistor 62 are connected to the $V_{DD}$ (again +25 volts) through gate follower depletion mode transistors 63 and 64 respectively. The memory MNOS transistor 60 has both its substrate and source electrodes connected directly to ground; thus the transistor is written with the full +25 volts. The reference MNOS transistor has its substrate connected to ground, while the source electrode is coupled to ground through a network of three load transistors 65 which produce at 2.4 volt voltage drop in this example. Therefore, in a manner similar to that illustrated in FIG. 3 above, the write voltage acting upon the reference MNOS transistor is reduced to a level of approximately 22.6 volts as opposed to the full 25 volts which acts upon the memory MNOS transistor within the memory array.

This memory sensing system takes advantage of the special characteristics of both MNOS and floating gate nonvolatile memory transistors in which higher write/erase voltages (for the same write/erase duration) produce lower write/erase threshold voltage shifts. Since the reference signal is from an identical MNOS or floating gate memory transistor, it is not affected by process variations or the change in the MNOS or floating gate memory transistor performance through cycling or the circuit operating conditions. Such operating conditions include chip operation at different operation voltages, varying write/erase duration times, and varying temperatures.

Additionally, this system can be used for bulk erase, bulk write, word erase and word write memory systems. The reference device can be at either a written or an erased state. The voltage reduction circuit can be tailored for special process conditions and the design margin requirements unique to a particular implementation. A small voltage drop design, which requires tighter process control, will offer greater retention (data keeping) and operating limits. On the other hand, a large voltage drop design will allow a somewhat larger processing variation with the trade-off of shorter limits.

Since there is no geometrical restriction as to where the reference bit lines must be emplaced, the reference bit lines can be mixed into the memory array to minimize the problem of process fluctuation. This advantage lends the use of this system to ready adaptation to large size and high density nonvolatile memory chip implementations. For MNOS implementation, this system appears to give superior results for the mono-gate MNOS device geometry since mono-gate devices provide the largest memory window. However, with simple modifications such as adding additional small voltage drops to the reference bit line, the system can also be used for split gate MNOS device geometries.

The concept of this invention may be used in any sense amplifier design. Both voltage sensing and current sensing designs may be utilized. Since the reference device provides an unweighted signal, it can be incorporated into the sense amplifer design for any sensitivity requirement. Additionally, the concept of this invention can be used for floating gate memory circuits as well. By writing the reference device at a lower voltage than the memory devices, it is readily possible to detect the "written" and "erased" status of an individual memory element within the memory array. This concept can be applied to the EAROM, the EEROM, and EERAM devices.

The majority of the discussion above has been directed towards implementing this system concept by reducing the write/erase voltage acting upon the reference device. However, the concept can also be implemented by writing/erasing the reference device with the same voltage as the memory devices but with a shorter write/erase duration. This implementation requires more circuitry for the necessary timing change for the reference bit lines, but may well be desirable for special cases. This particular embodiment is applicable to both the MNOS and floating gate memory devices as well.

We claim:

1. In a memory system comprising a nonvolatile memory transistor array, a self-tracking sensing apparatus comprising:
   means to select a nonvolatile memory transistor to be sensed within the array;
   a reference nonvolatile transistor wherein the reference transistor is substantially identical to the memory transistors in the memory array;
   means to program the threshold voltage of the reference transistor to a lower level than that of an identically programmed memory transistors; and
   means to compare the programmed state of the memory transistor with the programmed state of the reference transistor.

2. The apparatus of claim 1 wherein the nonvolatile transistors are MNOS transistors.

3. The apparatus of claim 1 wherein the nonvolatile transistors are floating gate transistors.

4. The apparatus of claim 1 wherein the means to program the threshold voltage of the reference transistor comprises a voltage reduction circuit.

5. The apparatus of claim 1 wherein the means to program the threshold voltage of the reference transistor comprises a timing circuit which reduces the duration of the programming means in relation to the duration of the action of the programming means upon a memory transistor.

6. The apparatus of claim 1 wherein the means to compare the programmed state of the memory transistor with the programmed state of the reference transistor comprises a voltage sensing amplifier.

7. The apparatus of claim 1 wherein the means to compare the program state of the memory transistor with the programmed state of the reference transistor comprises a current sensing amplifier.

* * * * *